(12) United States Patent
Wu et al.

(10) Patent No.: US 6,227,907 B1
(45) Date of Patent: May 8, 2001

(54) SURFACE MOUNTED ELECTRICAL CONNECTOR

(75) Inventors: Jerry Wu; Chyi-Sheng Wang, both of Tu-chen (TW)

(73) Assignee: Hon Hai Precision Ind. Co., Ltd., Taipei Hsein (TW)

( * ) Notice: Subject to any disclaimer, the term of this patent is extended or adjusted under 35 U.S.C. 154(b) by 0 days.

(21) Appl. No.: 09/470,335

(22) Filed: Dec. 22, 1999

(51) Int. Cl.$^7$ ...................................................... H01R 13/73
(52) U.S. Cl. .............................................................. 439/570
(58) Field of Search .................................... 439/570, 571, 439/572, 83

(56) References Cited

U.S. PATENT DOCUMENTS

| | | | |
|---|---|---|---|
| 5,194,017 | * 3/1993 | Consoli | 439/570 |
| 5,232,379 | * 8/1993 | Lai | 439/570 |
| 5,385,478 | * 1/1995 | Kiekawa | 439/570 |
| 6,053,763 | * 4/2000 | Brennan et al. | 439/570 |

* cited by examiner

Primary Examiner—Gary F. Pauman
(74) Attorney, Agent, or Firm—We Te Chung

(57) ABSTRACT

A surface mounted electrical connector comprises an insulative housing defining a holding cavity, a slot, and a securing channel. A plurality of terminals are secured in the insulative housing. Each of the pair of solder pads includes a vertical retaining portion for securely engaging with the holding cavity and a horizontal solder portion for soldering to a printed circuit board. The retaining portion further includes a positioning tab extending from the upper front edge of the retaining portion for securely engaging with the slot of the insulative housing, and a securing portion extending from a rear edge of the retaining portion for engagingly securing within the corresponding securing channel.

1 Claim, 3 Drawing Sheets

SURFACE MOUNTED ELECTRICAL CONNECTOR

BACKGROUND OF THE INVENTION

The present invention relates to an electrical connector having a pair of solder pads for surface mounting to a printed circuit board, and particularly to solder pads which have a positioning tab for preventing the connector from moving in a vertical direction.

Prior art U.S. Pat. Nos. 5,044,988, 4,713,013 and 4,850,892 disclose electrical connectors having posts integrally formed with the connector housing, and extending from the bottom surface of the housing. The designs disclosed in U.S. Pat. Nos. 4,681,389 and 4,907,987 and other recent patents replaced the integral posts, which had insufficient resiliency with resilient metallic posts which are assembled separately into the housing for retaining the connector on the board. A disadvantage of this connector is that it has insufficient holding strength to secure the connector on a printed circuit board when a vertical upward force is applied to the connector.

Hence, an improved solder pad for surface mounted electrical connectors is required to overcome the disadvantages of the prior art.

BRIEF SUMMARY OF THE INVENTION

An object of the present invention is to provide an electrical connector having an improved solder pad for surface mounting the electrical connector to a circuit board, the solder pad being capable of securing the connector from moving in the upright direction.

To fulfill the above mentioned objective, a surface mounted electrical connector in accordance with the present invention comprises an elongated insulative housing defining a holding cavity at either side thereof, a slot define in a side wall of the holding cavity, and a securing channel extending through the housing from the holding cavity to a rear face of the housing. A plurality of terminals are secured in the insulative housing. Each of the pair of solder pads includes a vertical retaining portion for securely engaging with the holding cavity and a horizontal solder portion extending from the lower edge of the retaining portion for soldering to the printed circuit board. Additionally, the retaining portion further includes a positioning tab extending from the upper front edge of the retaining portion for securely engaging with the slot of the insulative housing, and a securing portion extending from a rear edge of the retaining portion for engagingly securing within the corresponding securing channel.

Other objects, advantages and novel features of the invention will become more apparent from the following detailed description of the present embodiment when taken in conjunction with the accompanying drawings.

DETAILED DESCRIPTION OF THE INVENTION

Figure 1:
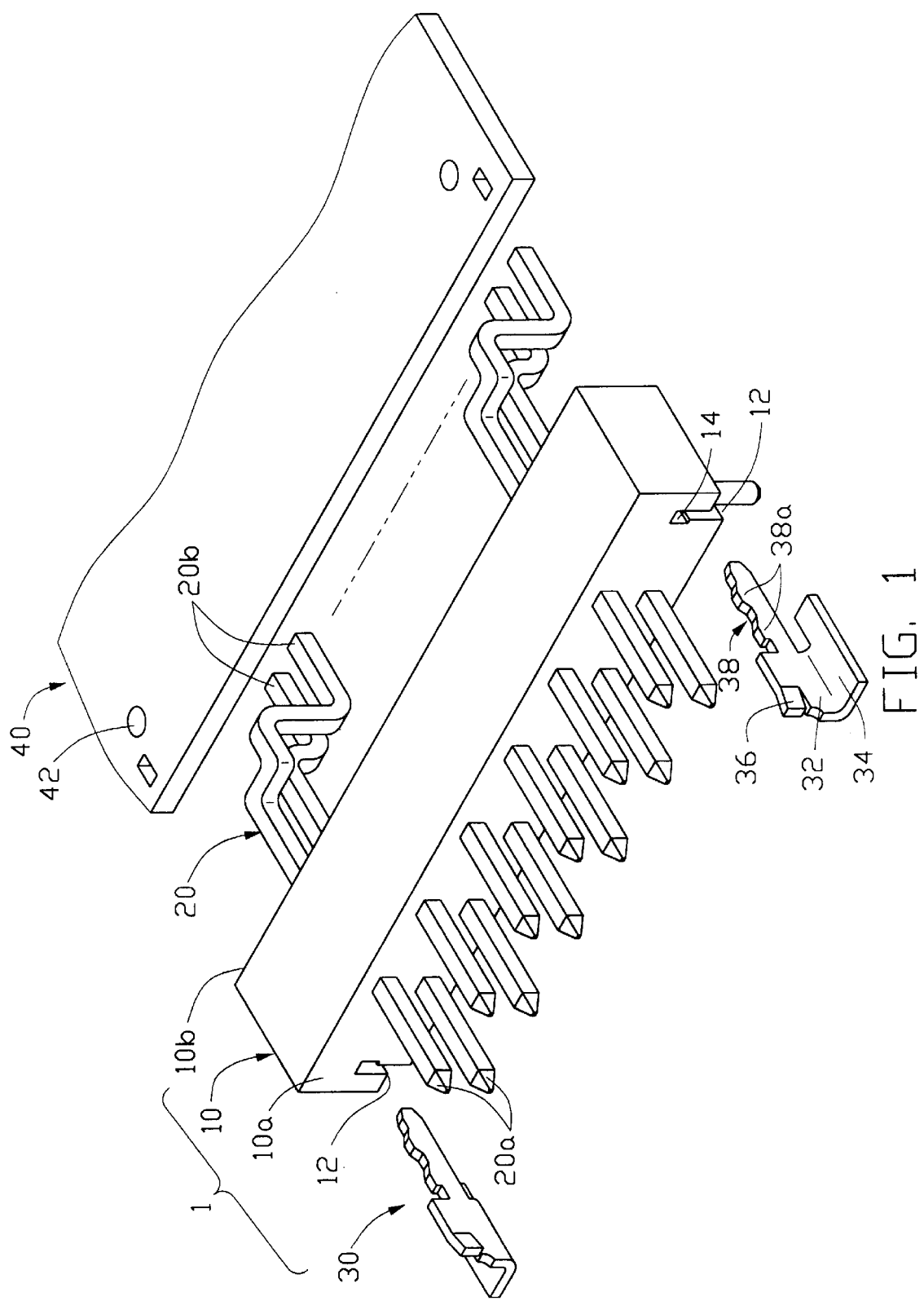
FIG. 1 is a partially assembled view of an electrical connector in accordance with the present invention.

Referring to FIG. 1, an electrical connector 1 in accordance with the present invention comprises an elongated insulative housing 10, a plurality of terminals 20 secured in the insulative housing 10, and a pair of solder pads 30 engagingly secured within opposite lateral sides (not labelled) of the insulative housing 10 then soldered to a printed circuit board 40.

The insulative housing 10 includes a rectangular holding cavity 12 incommunication with a front face 10a thereof and an elongated slot 14 defined in a side wall (not labelled) of the holding cavity 12 thereof. The insulative housing 10 further includes a securing channel 16 extending from the holding cavity 12 to a rear face 10b of the insulative housing 10. Furthermore, the insulative housing 10 include two openings 16a defined in an upper side of each securing channel 16. Additionally, the insulative housing 10 has two posts 18 extending from the bottom face (not labelled) thereof for inserting into a pair of holes 42 defined in the printed circuit board 40 when being secured thereon.

A plurality of terminals 20 are secured in the insulative housing by their middle portions, each terminal 20 comprising a mating portion 20a extending beyond the front face 10a of the insulative housing 10 for mating with a complementary connector (not shown), and a solder tail 20b extending beyond the rear face 10b of the insulative housing 10 for soldering to the printed circuit board 40.

Figure 3:
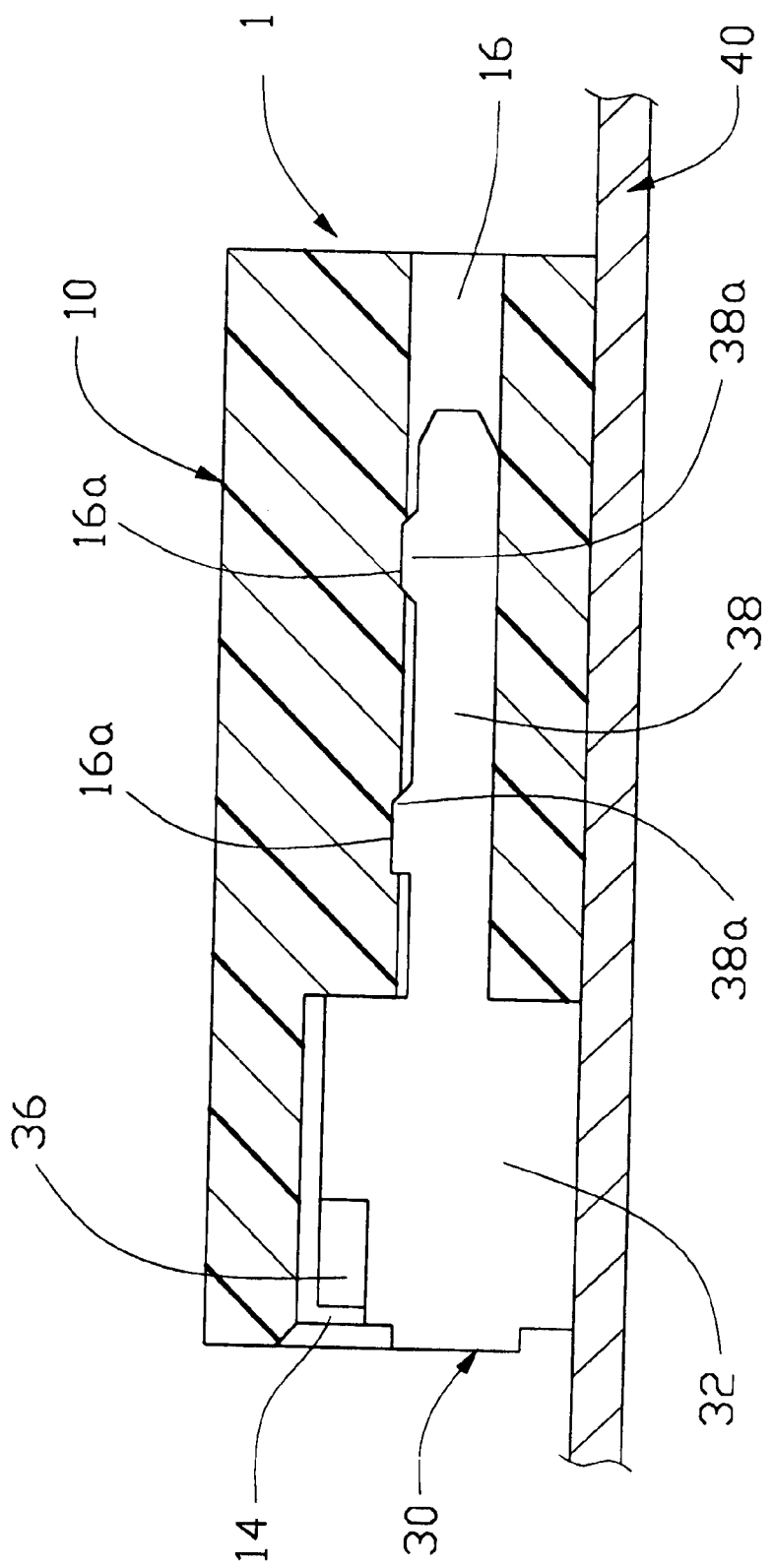
FIG. 3 is a cross-sectional view taken along line 3—3 in FIG. 2.

Referring to FIG. 1 and FIG. 3, each solder pad 30 includes a vertical retaining portion 32 for engagingly securing within the holding cavity 12 and a horizontal solder portion 34 extending from a lower edge of the retaining portion 32 for soldering to the printed circuit board 40. Each retaining portion 32 further includes a positioning tab 36 curving laterally from an upper front edge of the retaining portion 32 for securely engaging with the corresponding slot 14 of the insulative housing 10. Additionally, each solder pad 30 further includes a securing portion 38 extending from a rear edge of the retaining portion 32 opposite to the positioning tab 36 for engagingly securing within a corresponding securing channel 16. The securing portions 38 each form two protrusions 38a on an upper edge thereof for security engaging within the corresponding openings 16a, thereby making the engagement between the securing portion 38 and the securing channels more firm.

Figure 2:
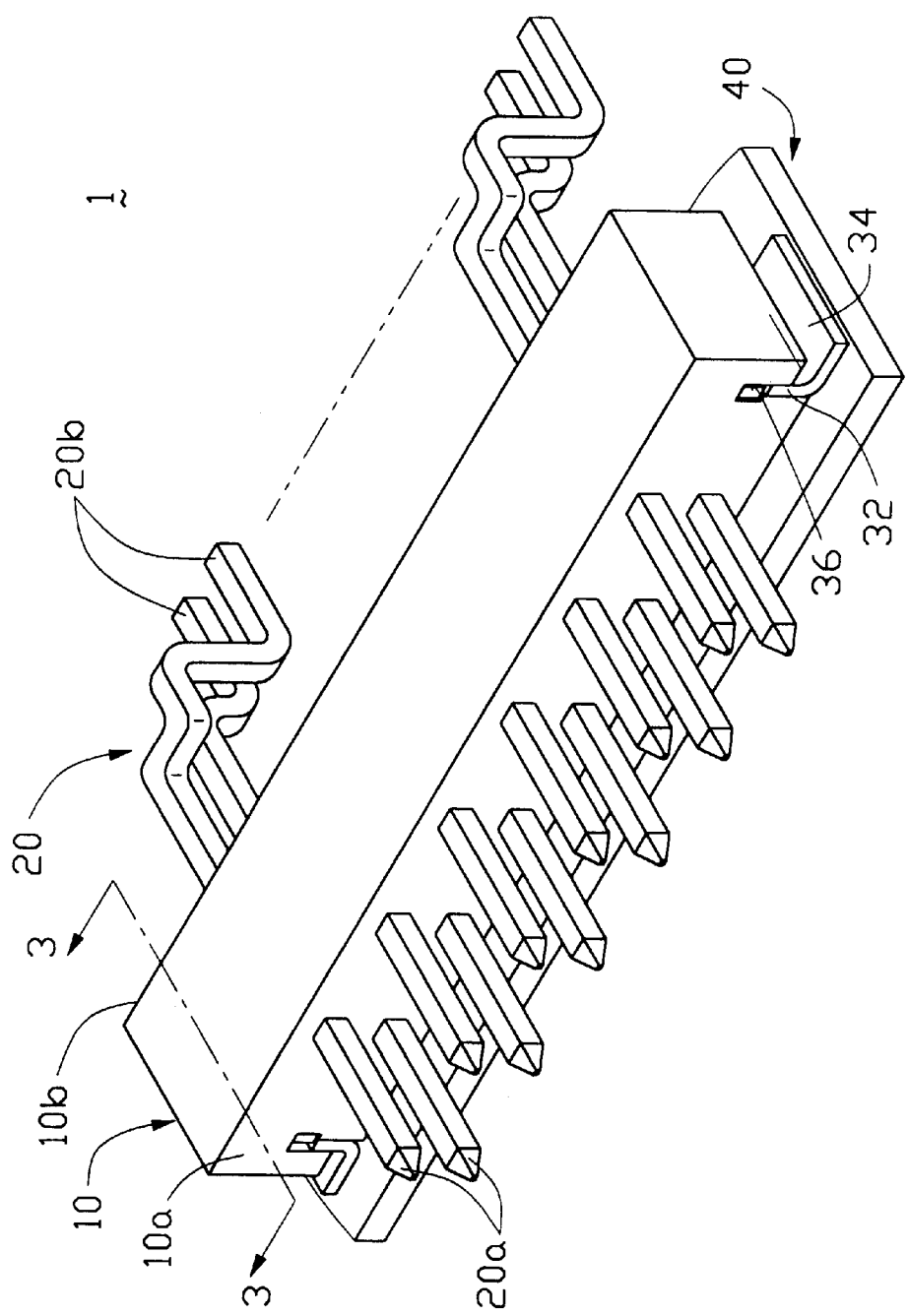
FIG. 2 is an assembled view of the connector of FIG. 1.

Also referring to FIG. 2 and FIG. 3, in assembly the solder pads 30 are first assembled into corresponding lateral sides of the insulative housing 10 from the front face 10a thereof, the retaining portions 32 being secured within the holding cavities 12 for enduring a lateral force applied on the connector, the positioning tabs 36 fitting embeddedly with the corresponding slots 14 for enduring an upright force applied on the connector. The soldering portions 34 are then soldered onto the printed circuit board 40, thereby securing the connector 1 thereon.

The advantage of the present invention is that the positioning tab 36 of each solder pad 30 can endure an external force applied to the connector in an upright direction, thereby firmly securing the connector 1 to the printed circuit board 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A surface mounted electrical connector for mounting to a printed circuit board, comprising:

an elongated insulative housing including a laterally oriented holding cavity defined vertically in an end thereof and a slot defined in a side wall of the holding cavity;

a plurality of terminals secured in the insulative housing; and a solder pad including a vertical retaining portion for engagingly securing within the holding cavity and a horizontal solder portion extending from a lower edge of the retaining portion for soldering to a printed circuit board, wherein the retaining portion forms a resilient positioning tab extending at an angle from an upper front edge of the retaining portion for securely engaging with the slot of the insulative housing;

wherein the insulative housing includes a laterally oriented securing channel in communication with the holding cavity and extending from the holding cavity to a rear face of the housing, and the retaining portion of the solder pad forms an elongated securing portion extending from a rear edge of the retaining portion for engagingly securing within the securing channel.

* * * * *